(12) United States Patent
Liu et al.

(10) Patent No.: US 12,477,887 B2
(45) Date of Patent: Nov. 18, 2025

(54) LIGHT-EMITTING SUBSTRATE AND DISPLAY DEVICE

(71) Applicant: TCL China Star Optoelectronics Technology Co., Ltd., Shenzhen (CN)

(72) Inventors: Jing Liu, Shenzhen (CN); Hongzhao Deng, Shenzhen (CN); Hao Chen, Shenzhen (CN); Linnan Chen, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/799,658

(22) PCT Filed: Jul. 25, 2022

(86) PCT No.: PCT/CN2022/107624
§ 371 (c)(1),
(2) Date: Aug. 13, 2022

(87) PCT Pub. No.: WO2024/011656
PCT Pub. Date: Jan. 18, 2024

(65) Prior Publication Data
US 2025/0113688 A1    Apr. 3, 2025

(30) Foreign Application Priority Data

Jul. 15, 2022 (CN) .......................... 202210835439.0

(51) Int. Cl.
*H10H 29/49* (2025.01)
*H10H 29/14* (2025.01)
*H10H 29/24* (2025.01)

(52) U.S. Cl.
CPC .......... *H10H 29/49* (2025.01); *H10H 29/142* (2025.01); *H10H 29/24* (2025.01)

(58) Field of Classification Search
None
See application file for complete search history.

(56) References Cited

U.S. PATENT DOCUMENTS

| 8,199,074 | B2 * | 6/2012 | Wang | ...................... G09G 3/006 |
| | | | | 345/83 |
| 9,123,289 | B2 * | 9/2015 | Kim | ...................... H10K 59/00 |

(Continued)

FOREIGN PATENT DOCUMENTS

| CN | 201383291 Y | 1/2010 |
| CN | 103135846 A * | 6/2013 ........... G06F 3/0412 |

(Continued)

OTHER PUBLICATIONS

Chinese Office Action issued in corresponding Chinese Patent Application No. 202210835439.0 dated Oct. 22, 2024, pp. 1-6.

(Continued)

*Primary Examiner* — Michael Lebentritt
(74) *Attorney, Agent, or Firm* — Nathan & Associates Patent Agents Ltd.; Menachem Nathan (57) ABSTRACT

The present application provides a light-emitting substrate and a display device, the light-emitting substrate includes a substrate, multiple signal lines, and multiple light-emitting units. The signal lines at least include a first signal line and a second signal line. The first signal line is provided with a signal access terminal and a first connection terminal. The second signal line is provided with a second connection terminal. The first connection terminal is electrically connected to the second connection terminal, and the signal access terminal receives signals.

20 Claims, 7 Drawing Sheets

(56) References Cited

U.S. PATENT DOCUMENTS

| | | | |
|---|---|---|---|
| 9,236,011 B2 * | 1/2016 | Mizukoshi | G09G 3/3233 |
| 2007/0195020 A1 * | 8/2007 | Nathan | G09G 3/3291 |
| | | | 345/76 |
| 2015/0001504 A1 * | 1/2015 | Kim | G09G 3/3208 |
| | | | 257/40 |
| 2018/0226386 A1 | 8/2018 | Cok | |
| 2022/0319449 A1 * | 10/2022 | Li | G09G 3/3413 |

FOREIGN PATENT DOCUMENTS

| | | |
|---|---|---|
| CN | 106940984 A | 7/2017 |
| CN | 108010942 A | 5/2018 |
| CN | 109801568 A | 5/2019 |
| CN | 110164326 A | 8/2019 |
| CN | 111129061 A | 5/2020 |
| CN | 111489691 A | 8/2020 |
| CN | 113130463 A | 7/2021 |
| CN | 114397781 A | 4/2022 |
| JP | H09106264 A | 4/1997 |
| TW | 202137175 A | 10/2021 |
| WO | 2021110332 A1 | 6/2021 |
| WO | 2021249120 A1 | 12/2021 |
| WO | 2022104752 A1 | 5/2022 |

OTHER PUBLICATIONS

Japanese Office Action issued in corresponding Japanese Patent Application No. 特願2022-552399 dated Aug. 30, 2024, pp. 1-11.
International Search Report in International application No. PCT/CN2022/107624,mailed on Dec. 22, 2022.
Written Opinion of the International Search Authority in International application No. PCT/CN2022/107624,mailed on Dec. 22, 2022.

\* cited by examiner

LIGHT-EMITTING SUBSTRATE AND DISPLAY DEVICE

The present application relates to a field of display technology and in particular, to a light-emitting substrate and a display device.

DESCRIPTION OF RELATED ART

The sub-millimeter light-emitting diode (LED) was first proposed by the Taiwanese company Epistar, which refers to a display screen composed of LEDs with a grain (chip) size of 50 microns to 200 microns, which is between miniature light-emitting diodes and small-pitch displays. Applications include sub-millimeter LED direct display and sub-millimeter LED backlight displays. The sub-millimeter LED display has excellent performance in energy consumption, color gamut, contrast ratios, flexibility, lifespans, etc., and manufacturing of the sub-millimeter LED display is not as difficult as manufacturing of the micro-LEDs. Therefore, it is relatively easy to manufacture the final products. As a result, the sub-millimeter LED is expected to become the leading product for LCD screen upgrades, and can compete with organic LED displays in the consumer market.

Screens using sub-millimeter LCD technology also have advantages such as long lifespans and low risks of burning the screens. Mass production can achieve lower costs compared to organic LED display screens. Certainly, the millimeter LED technology also has disadvantages: the more light-emitting units are integrated, the more regions the light-emitting units have, the more signal lines are used to electrically connect the light-emitting units, and the more corresponding ports are required for signal transmission, leading to higher production costs.

Therefore, there is an urgent need to reduce signal transmission ports so as to reduce the production costs of products.

SUMMARY

The present application provides a light-emitting substrate and a display device. By reducing the number of signal access terminals, less signal transmission ports are required, and production costs can be reduced.

In one aspect, the present application provides a light-emitting substrate, comprising:
  a substrate;
  multiple signal lines arranged on the substrate; and
  multiple light-emitting units arranged in an array pattern on the substrate, the light-emitting units electrically connected to the signal lines;
  wherein the signal lines at least comprise a first signal line and a second signal line, the light-emitting units comprise a first light-emitting unit and a second light-emitting unit, the first signal line is electrically connected to the first light-emitting unit, and the second signal line is electrically connected to the second light-emitting unit; and
  the first signal line is provided with a signal access terminal and a first connection terminal, the second signal line is provided with a second connection terminal, the first connection terminal is electrically connected to the second connection terminal, and the signal access terminal is configured for receiving signals.

Optionally, in some embodiments of the present application, the substrate comprises a first side and a second side disposed opposite to each other, and wherein the signal access terminal is disposed on the first side, and the first connection terminal and the second connection terminal are disposed on the second side; or alternatively, the signal access terminal and the second connection terminal are disposed on the first side, and the first connection terminal is disposed on the second side.

Optionally, in some embodiments of the present application, each of the light-emitting units comprises a driving chip and at least one light-emitting device, each of the driving chips is provided with a first pin and a second pin, the first pins are electrically connected to the light-emitting devices, and the second pins are electrically connected to the signal lines.

Optionally, in some embodiments of the present application, the light-emitting units include a first light-emitting unit column and a second light-emitting unit column, the first signal line is electrically connected to the first light-emitting unit column, the second signal line is electrically connected to the second light-emitting unit column, and the first light-emitting unit column and the second light-emitting unit column are disposed adjacent to each other.

Optionally, in some embodiments of the present application, the light-emitting substrate further comprises a connection line, one end of the connection line is electrically connected to the first connection terminal, and another end of the connection line is electrically connected to the second connection terminal.

Optionally, in some embodiments of the present application, the light-emitting substrate further comprises multiple connection lines, one end of each of the connection lines is electrically connected to the first connection terminal, and another end of each of the connection lines is electrically connected to the second connection terminal.

Optionally, in some embodiments of the present application, the light-emitting units further comprises a third light-emitting unit, the signal lines further comprise a third signal line, and the third signal line is electrically connected to the third light-emitting unit; and
  the third signal line is provided with a third connection terminal, the second connection terminal is electrically connected to the third connection terminal, and the third connection terminal is disposed on the first side or the second side.

Optionally, in some embodiments of the present application, the light-emitting units further comprises a third light-emitting unit, the signal lines further comprise a third signal line, and the third signal line is electrically connected to the third light-emitting unit;
  the second signal line is further provided with a third connection terminal, the third signal line is provided with a fourth connection terminal, and the third connection terminal is electrically connected to the fourth connection terminal; and
  wherein the third connection terminal and the fourth connection terminal are disposed on the first side; or alternatively, the third connection terminal is disposed on the first side, and the fourth connection terminal is disposed on the second side.

Optionally, in some embodiments of the present application, the light-emitting units further comprise a third light-emitting unit, the signal lines further comprise a third signal line, and the third signal line is electrically connected to the third light-emitting unit;
  the second signal line is further provided with a third connection terminal, the third signal line is provided with a fourth connection terminal, and the third connection terminal is electrically connected to the fourth connection terminal; and wherein the third connection terminal and the fourth connection terminal are disposed on the second side; or alternatively, the third connection terminal is disposed on the second side, and the fourth connection terminal is disposed on the first side.

Optionally, in some embodiments of the present application, the first signal line is disposed on a left side of the second signal line, and/or the first signal line is disposed on a right side of the second signal line.

In another aspect, the present application provides a display device comprising a light-emitting substrate, the light-emitting substrate comprising:

a substrate;

multiple signal lines arranged on the substrate; and multiple light-emitting units arranged in an array pattern on the substrate, the light-emitting units electrically connected to the signal lines;

wherein the signal lines at least comprise a first signal line and a second signal line, the light-emitting units comprise a first light-emitting unit and a second light-emitting unit, the first signal line is electrically connected to the first light-emitting unit, and the second signal line is electrically connected to the second light-emitting unit; and the first signal line is provided with a signal access terminal and a first connection terminal, the second signal line is provided with a second connection terminal, the first connection terminal is electrically connected to the second connection terminal, and the signal access terminal is configured for receiving signals.

Optionally, in some embodiments of the present application, the substrate comprises a first side and a second side disposed opposite to each other, the signal access terminal is disposed on the first side, and wherein the first connection terminal and the second connection terminal are disposed on the second side; or alternatively, the signal access terminal and the second connection terminal are disposed on the first side, and the first connection terminal is disposed on the second side.

Optionally, in some embodiments of the present application, each of the light-emitting units comprises a driving chip and at least one light-emitting device, each of the driving chips is provided with a first pin and a second pin, the first pins are electrically connected to the light-emitting device, and the second pins are electrically connected to the signal lines.

Optionally, in some embodiments of the present application, the light-emitting units include a first light-emitting unit column and a second light-emitting unit column, the first signal line is electrically connected to the first light-emitting unit column, the second signal line is electrically connected to the second light-emitting unit column, and the first light-emitting unit column and the second light-emitting unit column are disposed adjacent to each other.

Optionally, in some embodiments of the present application, the light-emitting substrate further comprises a connection line, one end of the connection line is electrically connected to the first connection terminal, and another end of the connection line is electrically connected to the second connection terminal.

Optionally, in some embodiments of the present application, the light-emitting substrate further comprises multiple connection lines, one end of each of the connection lines is electrically connected to the first connection terminal, and another end of each of the connection lines is electrically connected to the second connection terminal.

Optionally, in some embodiments of the present application, the light-emitting units further comprises a third light-emitting unit, the signal lines further comprise a third signal line, and the third signal line is electrically connected to the third light-emitting unit; and the third signal line is provided with a third connection terminal, the second connection terminal is electrically connected to the third connection terminal, and the third connection terminal is disposed on the first side or the second side.

Optionally, in some embodiments of the present application, the light-emitting units further comprises a third light-emitting unit, the signal lines further comprise a third signal line, and the third signal line is electrically connected to the third light-emitting unit;

the second signal line is further provided with a third connection terminal, the third signal line is provided with a fourth connection terminal, and the third connection terminal is electrically connected to the fourth connection terminal; and wherein the third connection terminal and the fourth connection terminal are disposed on the first side; or alternatively, the third connection terminal is disposed on the first side, and the fourth connection terminal is disposed on the second side.

Optionally, in some embodiments of the present application, the light-emitting units further comprise a third light-emitting unit, the signal lines further comprise a third signal line, and the third signal line is electrically connected to the third light-emitting unit;

the second signal line is further provided with a third connection terminal, the third signal line is provided with a fourth connection terminal, and the third connection terminal is electrically connected to the fourth connection terminal; and wherein the third connection terminal and the fourth connection terminal are disposed on the second side; or alternatively, the third connection terminal is disposed on the second side, and the fourth connection terminal is disposed on the first side.

Optionally, in some embodiments of the present application, the first signal line is disposed on a left side of the second signal line, and/or the first signal line is disposed on a right side of the second signal line.

Advantages of the Present Application

The present application provides a light-emitting substrate and a display device. The light-emitting substrate includes: a substrate, a plurality of signal lines, and a plurality of light-emitting units. Specifically, the signal lines are disposed on the substrate. The light-emitting units are arranged in an array pattern on the substrate. The light-emitting units are electrically connected to the signal lines. The signal lines at least include a first signal line and a second signal line. The light-emitting units include a first light-emitting unit and a second light-emitting unit. The first signal line is electrically connected to the first light-emitting unit, and the second signal line is electrically connected to the second light-emitting unit. The first signal line is provided with a signal access terminal and a first connection terminal, the second signal line is provided with a second connection terminal, the first connection terminal is electrically connected to the second connection terminal, and the signal access terminal is configured to receive signals. The light-emitting substrate of the present application reduces the number of the signal access terminals by electrically connecting the first signal line to the second signal line, thereby reducing production costs and improving product competitiveness.

BRIEF DESCRIPTION OF DRAWINGS

In order to more clearly illustrate the embodiments of the present application, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DETAILED DESCRIPTION OF EMBODIMENTS

The technical solutions of the present application will be clearly and completely described below with reference to the accompanying drawings and in conjunction with the embodiments of the present application. Obviously, the described embodiments are only some of the embodiments of the present application, but not all of the embodiments. Based on the embodiments in the present application, all other embodiments obtained by those skilled in the art without creative efforts shall fall within the protection scope of the present application.

The present application provides a light-emitting substrate and a display device, which have less signal transmission ports, so as to reduce product production costs. The present application is described in detail below. It should be noted that a description order of the following embodiments is not intended to limit a preferred order of the embodiments. In addition, in the description of the present application, the term "including" means "including, but not limited to". The terms like "first", "second", and "third" are used merely as labels to distinguish between different objects, rather than to describe a particular order.

Figure 1A:
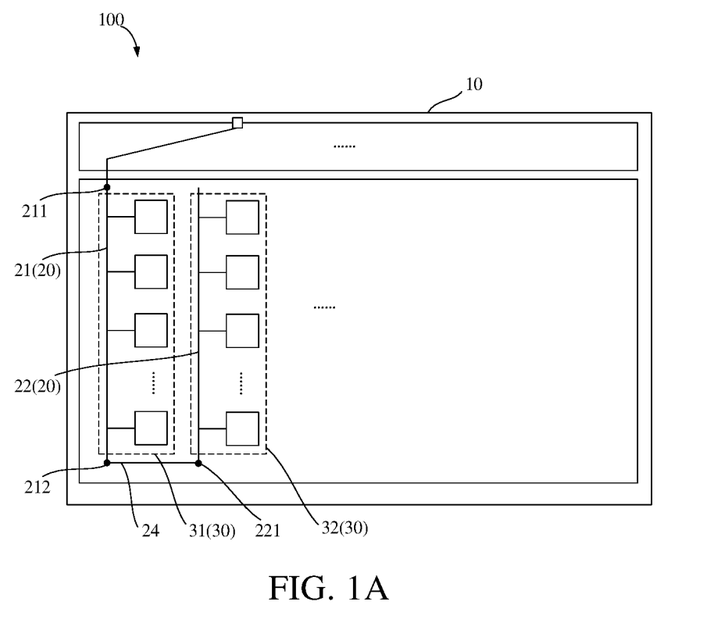
FIG. 1A is a first schematic view of a light-emitting substrate according to one embodiment of the present application.
Figure 1B:
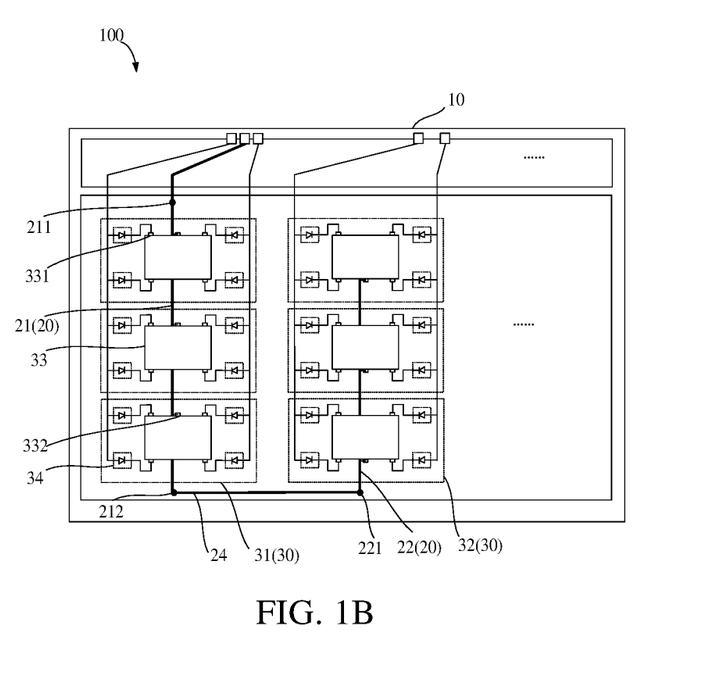
FIG. 1B is a schematic view of a light-emitting unit of the light-emitting substrate shown in FIG. 1A.

Please refer to FIG. 1A. FIG. 1A is a first schematic view of a light-emitting substrate according to one embodiment of the present application. FIG. 1B is a schematic structural view of a light-emitting unit of the light-emitting substrate shown in FIG. 1A. As shown in FIG. 1A, the present application provides a light-emitting substrate 100, including: a substrate 10, a plurality of signal lines 20, and a plurality of light-emitting units 30. Specifically, the signal lines 20 are disposed on the substrate 10. The light-emitting units 30 are arranged in an array pattern on the substrate 10. The light-emitting units 30 are electrically connected to the signal lines 20. The signal lines 20 at least include a first signal line 21 and a second signal line 22. The light-emitting units 30 include a first light-emitting unit 31 and a second light-emitting unit 32. The first signal line 21 is electrically connected to the first light-emitting unit 31, and the second signal line 22 is electrically connected to the second light-emitting unit 32. The first signal line 21 is provided with a signal access terminal 211 and a first connection terminal 212, the second signal line 22 is provided with a second connection terminal 221, the first connection terminal 212 is electrically connected to the second connection terminal 221, and the signal access terminal 211 is configured to receive signals.

The light-emitting substrate 100 of the present application reduces the number of the signal access terminals 211 by electrically connecting the first signal line 21 and the second signal line 22, thereby reducing the number of signal transmission ports, reducing product production costs, and improving product competitiveness.

It should be noted that FIG. 1A only shows that the first signal line 21 is disposed on a left side of the second signal line 22. That is to say, signals pass through the signal access terminal 211 disposed at one end of the first signal line 21 to be transmitted from left to right to the second signal line 22. Specifically, the first signal line 21 can also be disposed on a right side of the second signal line 22. That is to say, signals pass through the signal access terminal 211 disposed at one end of the first signal line 21 to be transmitted from right to left to the second signal line 22. The signal lines 20 are arranged in a same layer, and can also be arranged in different metal layers.

In the present application, the substrate 10 comprises a first side and a second side arranged opposite to each other, the signal access terminal 211 is arranged on the first side, and the first connection terminal 212 and the second connection terminal 221 are arranged on the second side. The substrate 10 can be a printed circuit board, a glass substrate 10, a flexible substrate 10, or the like.

In the present application, the light-emitting substrate further includes a connection line 24. One end of the connection line 24 is electrically connected to the first connection terminal 212, and another end of the connection line 24 is electrically connected to the second connection terminal 221.

In the present application, the light-emitting units 30 include a first light-emitting unit column 31 and a second light-emitting unit column 32. The first signal line 21 is electrically connected to the first light-emitting unit column 31, and the second signal line 22 is electrically connected to the second light-emitting unit column 32. Preferably, the first light-emitting unit column 31 and the second light-emitting unit column 32 are arranged adjacent to each other. Such a design is beneficial to sequentially transmit data signals to multiple columns of the light-emitting units 30 on the substrate 10, prevent differences in impedance caused by time differences, and prevent display problems caused by differences in charging capacity and so on. Specifically, the first light-emitting unit column 31 and the second light-emitting unit column 32 can be not arranged adjacent to each other, and those skilled in the art can make adjustments as needed, which is not specifically limited in the present application.

In the present application, the first signal line 21 is electrically connected to multiple second signal lines 22, and the number of the second signal lines 22 is less than 20. Specifically, the first signal line 21 can be electrically connected to 2, 3, 4, 5, . . . 18 second signal lines 22. Preferably, there are less than 20 second signal lines 22 that are electrically connected to the first signal line 21. Such a design can prevent the impedance from being too great due to too many signal lines 20 connected to each other, which significantly affects the display performance.

In the present application, each of the light-emitting units 30 includes a driving chip 33 and at least one light-emitting device 34. The driving chip 33 is provided with a first pin 331 and a second pin 332. The first pin 331 is electrically connected to the light-emitting device 34. The second pin 332 is electrically connected to the signal line 20. FIG. 1B shows an example that one driving chip 33 is electrically connected to four light-emitting devices 34, one first signal line 21 is electrically connected to three first light-emitting units 31, and one second signal line 22 is electrically connected to three second light-emitting units 32. Specifically, one driving chip 33 can control 1 to 20 light-emitting device groups, and one light-emitting device group can include 4 to 20 light-emitting devices 34. Each signal line 20 can control at least one column of the light-emitting units 30, that is, 5 to 100 driving chips. Those skilled in the art can adjust the number of the light-emitting devices 34 and the number of the light-emitting units 30 connected in series on the signal line 20 according to actual needs, and the present application is not specifically limited in this regard. The light-emitting device can be a micro light-emitting diode (micro-LED), a mini light-emitting diode (mini-LED), or an organic light-emitting diode (OLED).

In the present application, the signal line 20 refers to a data line for transmitting data signals. Specifically, by electrically connecting every two, three or more columns of the data lines, the number of data signal input ports which are located out-of-plane and input signals to the light-emitting substrate becomes ½, ⅓, ¼. . . of the original number. The number of channels of backlight control units and the number of the backlight control units can be reduced, which results in reduced production costs. Further, the signal lines 20 can further include a light control line (not illustrated), a ground line (not illustrated), a signal input line (not illustrated), and a signal output line (not illustrated).

Figure 2:
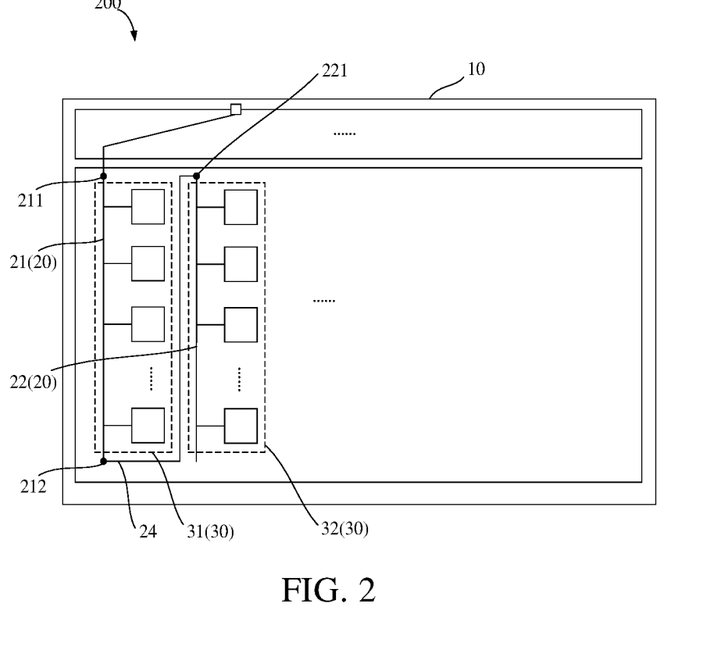
FIG. 2 is a second schematic view of the light-emitting substrate according to one embodiment of the present application.

Please refer to FIG. 2 as a specific embodiment of the present application. FIG. 2 is a second schematic view of the light-emitting substrate according to one embodiment of the present application. As shown in FIG. 2, the present application provides a light-emitting substrate 200. The light-emitting substrate 200 is different from the light-emitting substrate 100 in that the substrate 10 has a first side and a second side disposed opposite to each other, the signal access terminal 211 and the second connection terminal 221 are disposed on the first side, and the first connection terminal 212 is disposed on the second side. Such a design enables two columns of the light-emitting units 30 connected in series to receive signals in a direction from top to bottom while reducing the number of the signal access terminals 211, which is beneficial to achieve substantially equal charging time of the light-emitting units 30 in a same row in different columns of the light-emitting units 30.

In the present application, the light-emitting substrate 200 includes a substrate 10, multiple signal lines 20, a connection line 24, and multiple light-emitting units 30. Specifically, the substrate 10 includes a first side and a second side arranged opposite to each other. The signal lines 20 are arranged on the substrate 10. The light-emitting units 30 are arranged in an array pattern on the substrate 10. The light-emitting units 30 are electrically connected to one signal line 20. The signal lines 20 include a first signal line 21 and a second signal line 22. The light-emitting units 30 include a first light-emitting unit 31 and a second light-emitting unit 32. The first signal line 21 is electrically connected to the first light-emitting unit 31, and the second signal line 22 is electrically connected to the second light-emitting unit 32. The first signal line 21 is provided with a signal access terminal 211 and a first connection terminal 212. The second signal line 22 is provided with a second connection terminal 221. The first connection terminal 212 is electrically connected to the second connection terminal 221. The signal access terminal 211 is used for receiving signals. The signal access terminal 211 and the second connection terminal 221 are arranged on the first side, and the first connection terminal 212 is arranged on the second side. One end of the connection line 24 is electrically connected to the first connection terminal 212, and another end of the connection line 24 is electrically connected to the second connection terminal 221.

Figure 3:
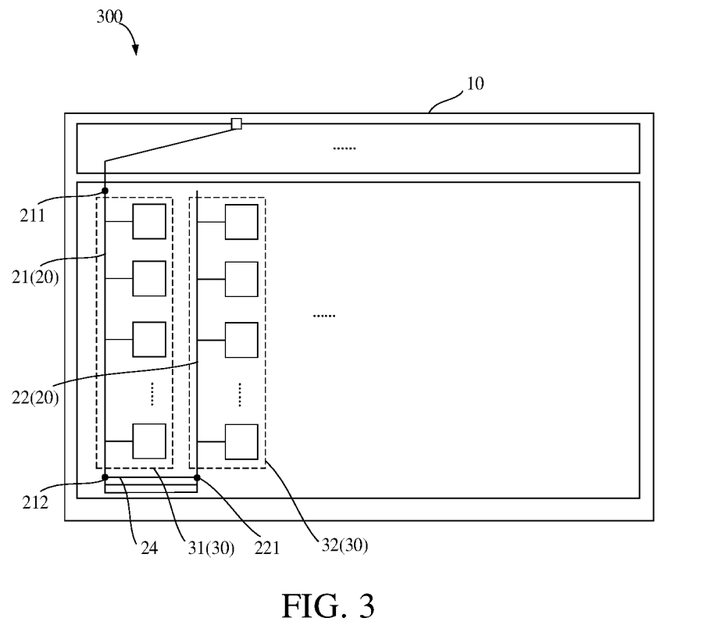
FIG. 3 is a third schematic view of the light-emitting substrate according to one embodiment of the present application.

Please refer to FIG. 3 for a specific embodiment of the present application. FIG. 3 is a third schematic view of the light-emitting substrate according to one embodiment of the present application. As shown in FIG. 3, the present application provides a light-emitting substrate 300. The light-emitting substrate 300 is different from the light-emitting substrate 100 in that the light-emitting substrate 300 includes multiple connection lines 24, one end of each connection line 24 is electrically connected to the first connection terminal 212, and another end of each connection line 24 is electrically connected to the second connection terminal 221. Such a design can reduce the number of the signal access terminals 211. At the same time, by connecting the connection lines 24 in parallel, the design can reduce the impedance of the signal lines 20, improve the stability of the signals, and achieve substantially equal charging time among the light-emitting units 30.

In the present embodiment, the light-emitting substrate 300 includes a substrate 10, multiple signal lines 20, multiple connection lines 24, and multiple light-emitting units 30. Specifically, the substrate 10 includes a first side and a second side arranged opposite to each other. The signal lines 20 are arranged on the substrate 10. The light-emitting units 30 are arranged in an array pattern on the substrate. The light-emitting units 30 are electrically connected to one signal line 20. The signal lines 20 include a first signal line 21 and a second signal line 22. The light-emitting units 30 include a first light-emitting unit 31 and a second light-emitting unit 32. The first signal line 21 is electrically connected to the first light-emitting unit 31, and the second signal line 22 is electrically connected to the second light-emitting unit 32. The first signal line 21 is provided with a signal access terminal 211 and a first connection terminal 212. The second signal line 22 is provided with a second connection terminal 221. The first connection terminal 212 is electrically connected to the second connection terminal 221, and the signal access terminal 211 is used for receiving signals. The signal access terminal 211 is arranged on the first side, and the first connection terminal 212 and the second connection terminal 221 are arranged on the second side. One end of each connection line 24 is electrically connected to the first connection terminal 212, and another end of each connection line 24 is electrically connected to the second connection terminal 221.

Figure 4:
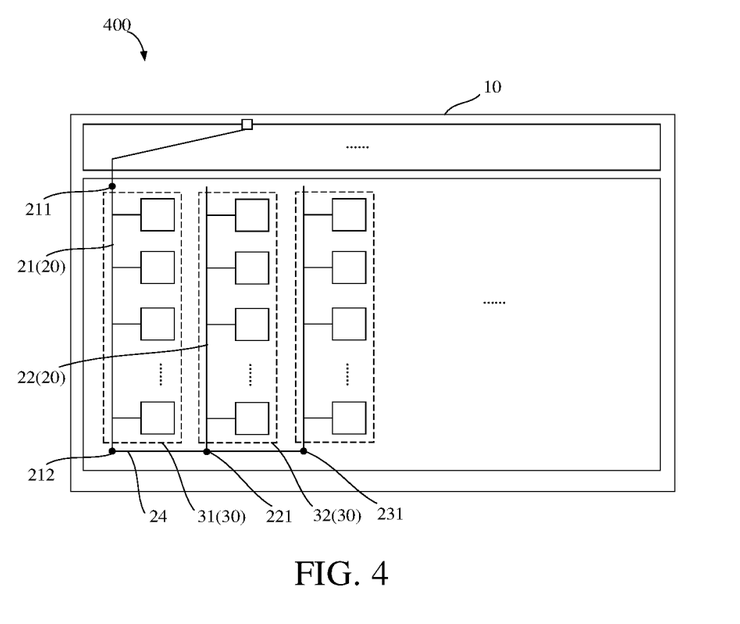
FIG. 4 is a fourth schematic view of the light-emitting substrate according to one embodiment of the present application.
Figure 5:
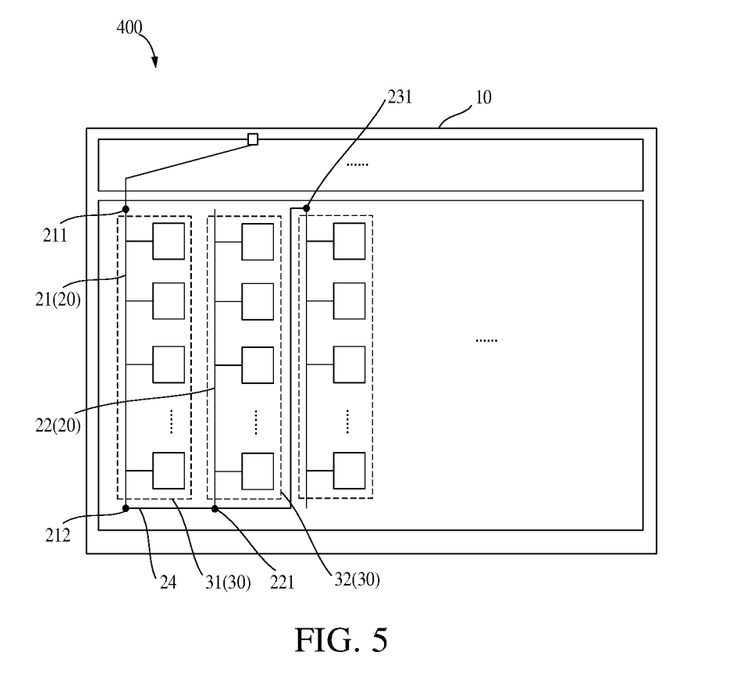
FIG. 5 is a fifth schematic view of the light-emitting substrate according to one embodiment of the present application.

Please refer to FIG. 4 and FIG. 5 for a specific embodiment of the present application. FIG. 4 is a fourth schematic view of the light-emitting substrate according to one embodiment of the present application. FIG. 5 is a fifth schematic view of the light-emitting substrate according to one embodiment of the present application. As shown in FIG. 4 and FIG. 5, the present application provides a light-emitting substrate 400. The light-emitting substrate 400 is different from the light-emitting substrate 100 in that the light-emitting units 30 further include a third light-emitting unit 35, the signal lines 20 further include a third signal line 23, and the third signal line 23 is electrically connected to the third light-emitting unit 35. The third signal line 23 is also provided with a third connection terminal 231. The second connection terminal 221 is electrically connected to the third connection terminal 231. The third connection terminal 231 is arranged on the first side, or the third connection terminal 231 is arranged on the second side. With such a design, while reducing the number of signal access terminals 211, the present embodiment reduces the impedance of the signal lines 20 by connecting the second signal lines 22 in parallel with the first signal line 21. Also, the signal stability is improved, and substantial equal charging time among the light-emitting units 30 is achieved.

In the present embodiment, the light-emitting substrate 400 includes a substrate 10, multiple signal lines 20, a connection line 24, and multiple light-emitting units 30. Specifically, the substrate 10 has a first side and a second side arranged opposite to each other. The signal lines 20 are arranged on the substrate 10. The light-emitting units 30 are arranged in an array on the substrate 10. The light-emitting units are electrically connected to one signal line 20. The signal lines 20 include a first signal line 21 and a second signal line 22. The light-emitting units 30 include a first light-emitting unit 31 and a second light-emitting unit 32. The first signal line 21 is electrically connected to the first light-emitting unit 31. The second signal line 22 is electrically connected to the second light-emitting unit 32. The first signal line 21 is provided with a signal access terminal 211 and a first connection terminal 212, and the second signal line 22 is provided with a second connection terminal 221. The first connection terminal 212 is electrically connected to the second connection terminal 221, and the signal access terminal 211 is used for receiving signals. The signal access terminal 211 is arranged on the first side, and the first connection terminal 212 and the second connection terminal 221 are arranged on the second side. One end of the connection line 24 is electrically connected to the first connection terminal 212. Another end of the connection line 24 is electrically connected to the second connection terminal 221.

Figure 6:
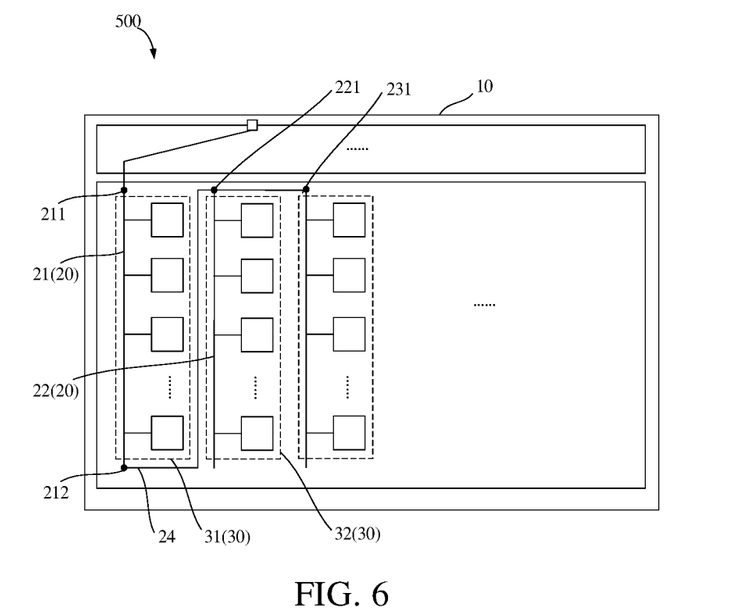
FIG. 6 is a sixth schematic view of the light-emitting substrate according to one embodiment of the present application.
Figure 7:
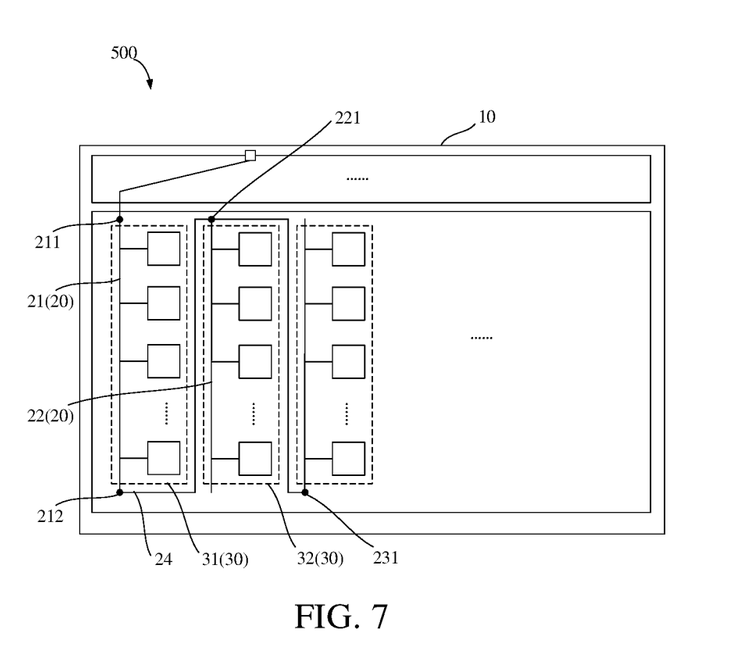
FIG. 7 is a seventh schematic view of the light-emitting substrate according to one embodiment of the present application.

Please refer to FIG. 6 and FIG. 7 for a specific embodiment of the present application. FIG. 6 is a six schematic view of the light-emitting substrate according to one embodiment of the present application. FIG. 7 is a seventh schematic view of the light-emitting substrate according to one embodiment of the present application. As shown in FIG. 6 and FIG. 7, the present application provides a light-emitting substrate 500. The light-emitting substrate 500 is different from the light-emitting substrate 200 in that the light-emitting units 30 further include a third light-emitting unit 35, the signal lines 20 further includes a third signal line 23, and the third signal line 23 is electrically connected to the third light-emitting unit 35. The third signal line 23 is also provided with a third connection terminal 231, and the second connection terminal 221 is electrically connected to the third connection terminal 231. The third connection terminal 231 is arranged on the first side, or the third connection terminal 231 is arranged on the second side. With such a design, while reducing the number of the signal access terminals 211, the present embodiment reduces the impedance of the signal line 20 by connecting multiple second signal lines 22 in parallel with the first signal line 21. Also, the signal stability is also improved, and substantially equal charging time among the light-emitting units 30 is achieved.

In the present embodiment, the light-emitting substrate 500 further includes a substrate 10, multiple signal lines 20, a connection line 24, and multiple light-emitting units 30. Specifically, the substrate 10 includes a first side and a second side arranged opposite to each other. The signal lines 20 are arranged on the substrate 10. The light-emitting units 30 are arranged in an array pattern on the substrate 10. The light-emitting units 30 are electrically connected to one signal line 20. The signal lines 20 include a first signal line 21 and a second signal line 22. The light-emitting units 30 include a first light-emitting unit 31 and a second light-emitting unit 32. The first signal line 21 is electrically connected to the first light-emitting unit 31. The second signal line 22 is electrically connected to the second light-emitting unit 32. The first signal line 21 is provided with a signal access terminal 211 and a first connection terminal 212, and the second signal line 22 is provided with a second connection terminal 221. The first connection terminal 212 is electrically connected to the second connection terminal 221, and the signal access terminal 211 is used for receiving signals. The signal access terminal 211 and the second connection terminal 221 are arranged on the first side, and the first connection terminal 212 is arranged on the second side. One end of the connection line 24 is electrically connected to the first connection terminal 212, and another end of the connection line 24 is electrically connected to the second connection terminal 221.

Figure 8:
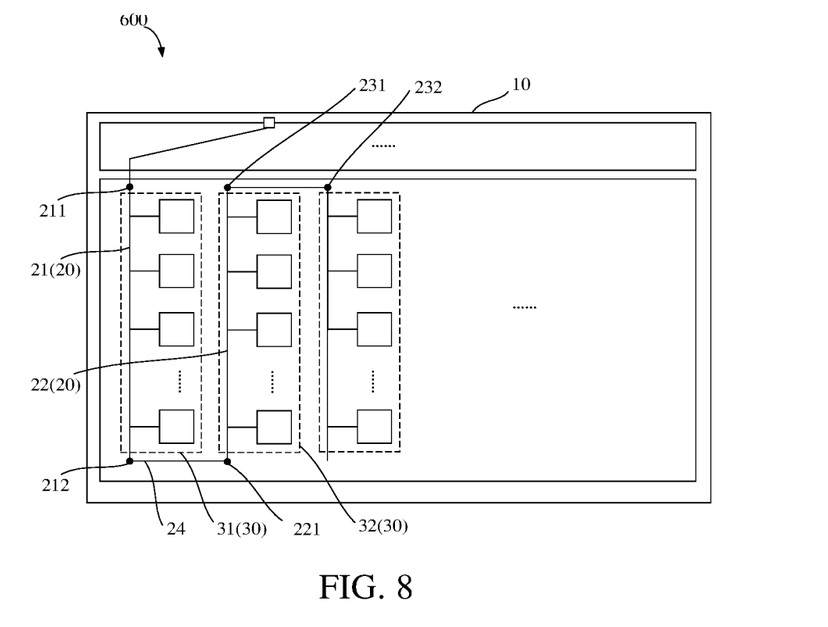
FIG. 8 is an eighth schematic view of the light-emitting substrate according to one embodiment of the present application.
Figure 9:
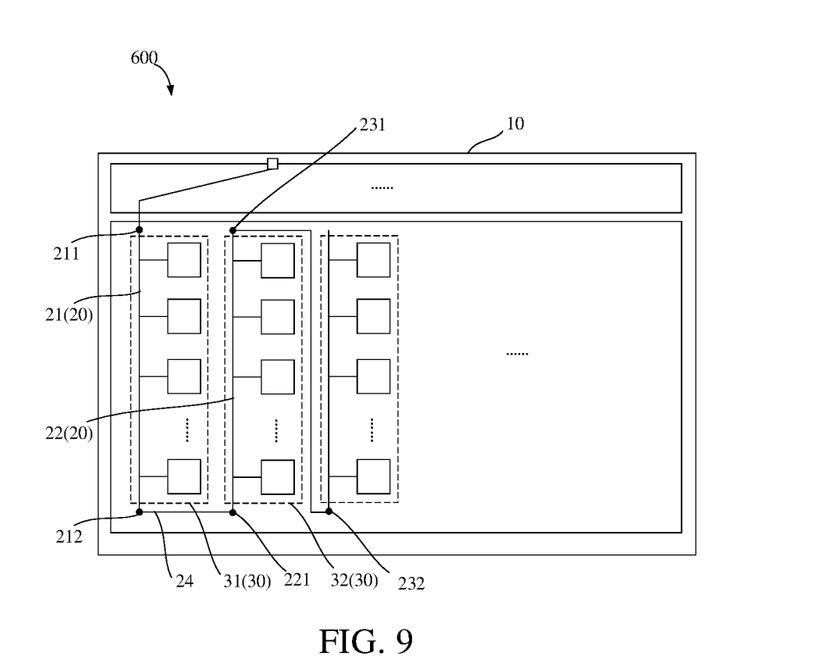
FIG. 9 is a ninth schematic view of the light-emitting substrate according to one embodiment of the present application.

Please refer to FIG. 8 and FIG. 9 for a specific embodiment of the present application. FIG. 8 is an eight schematic view of the light-emitting substrate according to one embodiment of the present application. FIG. 9 is a ninth schematic view of the light-emitting substrate according to one embodiment of the present application. As shown in FIG. 8 and FIG. 9, the present embodiment provides a light-emitting substrate 600. The light-emitting substrate 600 is different from the light-emitting substrate 100 in that the light-emitting units 30 further include a third light-emitting unit 35, the signal lines 20 further include a third signal line 23, and the third signal line 23 is electrically connected to the third light-emitting unit 35. The second signal line 22 is also provided with a third connection terminal 231, the third signal line 23 is provided with a fourth connection terminal 232, and the third connection terminal 231 is electrically connected to the fourth connection terminal 232. The third connection terminal 231 and the fourth connection terminal 232 are arranged on the first side; or alternatively, the third connection terminal 231 is arranged on the first side, and the fourth connection terminal 232 is arranged on the second side. With such a design, by connecting multiple columns of the light-emitting units 30 in series, the present application can further reduce the number of the signal access terminals 211, and correspondingly, the number of channels of backlight control units and the number of backlight control units can also be reduced, thereby reducing production costs.

In the present embodiment, the light-emitting substrate 600 includes a substrate 10, multiple signal lines 20, a connection line 24, and multiple light-emitting units 30. Specifically, the substrate 10 includes a first side and a second side arranged opposite to each other. The multiple signal lines 20 are arranged on the substrate 10. The light-emitting units 30 are arranged in an array pattern on the substrate 10. The light-emitting units 30 are electrically connected to one signal line 20. The signal lines 20 include a first signal line 21, a second signal line 22, and a third signal line 23. The light-emitting units 30 include a first light-emitting unit 31, a second light-emitting unit 32, and a third light-emitting unit 35. The first signal line 21 is electrically connected to the first light-emitting unit 31, the second signal line 22 is electrically connected to the second light-emitting unit 32, and the third signal line 23 is electrically connected to the third light-emitting unit 35. The first signal line 21 is provided with a signal access terminal 211 and a first connection terminal 212. The signal access terminal 211 is arranged on the first side, and the first connection terminal 212 is arranged on the second side. The second signal line 22 is provided with a second connection terminal 221 and a third connection terminal 231. The third signal line 23 is provided with a fourth connection terminal 232, and the first connection terminal 212 is electrically connected to the second connection terminal 221. The signal access terminal 211 is used for receiving signals. The third connection terminal 231 is electrically connected to the fourth connection terminal 232. The second connection terminal 221 is arranged on the second side. The third connection terminal 231 and the fourth connection terminal 232 are arranged on the first side. One end of the connection line 24 is electrically connected to the first connection terminal 212, and another end of the connection line 24 is electrically connected to the second connection terminal 221.

Figure 10:
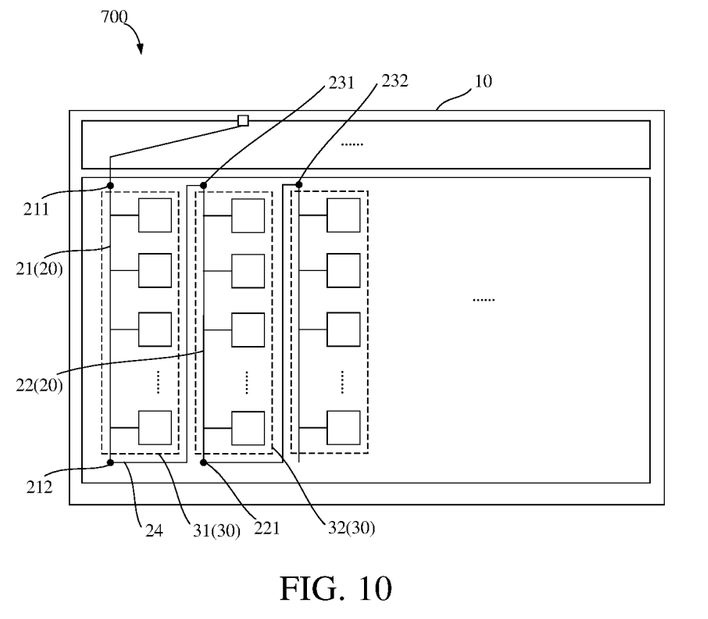
FIG. 10 is a tenth schematic view of the light-emitting substrate according to one embodiment of the present application.
Figure 11:
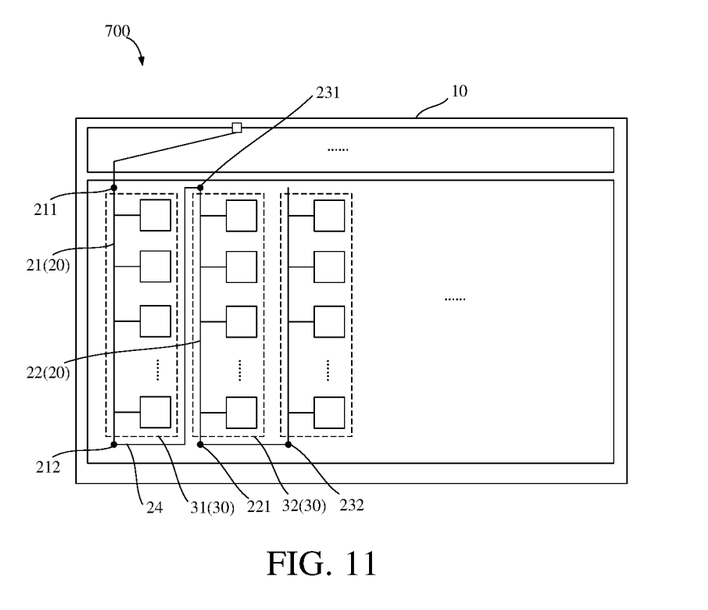
FIG. 11 is an eleventh schematic view of the light-emitting substrate according to one embodiment of the present application.

Please refer to FIG. 10 and FIG. 11 for a specific embodiment of the present application. FIG. 10 is a tenth schematic view of the light-emitting substrate according to one embodiment of the present application. FIG. 11 is an eleventh schematic view of the light-emitting substrate according to one embodiment of the present application. As shown in FIG. 10 and FIG. 11, the present application provides a light-emitting substrate 700. The light-emitting substrate 700 is different from the light-emitting substrate 200 in that the light-emitting units 30 further includes a third light-emitting unit 35, the signal lines 20 further include a third signal line 23, and the third signal line 23 is electrically connected to the third light-emitting unit 35. The second signal line 22 is also provided with a third connection terminal 231, the third signal line 23 is provided with a fourth connection terminal 232, and the third connection terminal 231 is electrically connected to the fourth connection terminal 232. The third connection terminal 231 and the fourth connection terminal 232 are arranged on the second side; or alternatively, the third connection terminal 231 is arranged on the second side, and the fourth connection terminal 232 is arranged on the first side. With such a design, by connecting multiple columns of the light-emitting units 30 in series, the present application can further reduce the number of the signal access terminals 211, and correspondingly, the number of channels of backlight control units and the number of the backlight control units can be reduced. Consequently, the present application can reduce production costs.

In the present embodiment, the light-emitting substrate 700 further includes a substrate 10, multiple signal lines 20, a connection line 24, and multiple light-emitting units 30. Specifically, the substrate 10 includes a first side and a second side arranged opposite to each other. The signal lines 20 are arranged on the substrate 10. The light-emitting units 30 are electrically connected to one signal line 20. The signal lines 20 include a first signal line 21 and a second signal line 22, and the light-emitting units 30 include a first light-emitting unit 31 and a second light-emitting unit 32. The first signal line 21 is electrically connected to the first light-emitting unit 31. The second signal line 22 is electrically connected to the second light-emitting unit 32. The first signal line 21 is provided with a signal access terminal 211 and a first connection terminal 212, and the second signal line 22 is provided with a second connection terminal 221. The first connection terminal 212 is electrically connected to the second connection terminal 221, and the signal access terminal 211 is used for receiving signals. The signal access terminal 211 and the second connection terminal 221 are arranged on the first side, and the first connection terminal 212 is arranged on the second side. One end of the connection line 24 is electrically connected to the first connection terminal 212, and another end of the connection line 24 is electrically connected to the second connection terminal 221.

Figure 12:
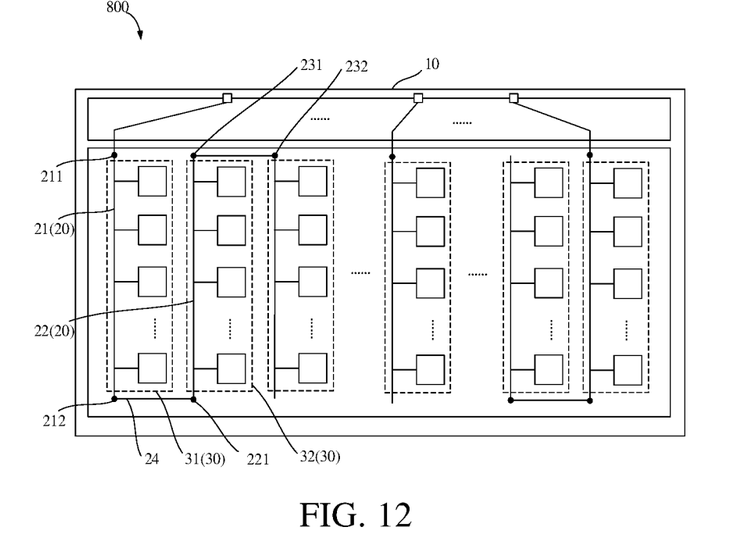
FIG. 12 is a twelfth schematic view of the light-emitting substrate according to one embodiment of the present application.

Please refer to FIG. 12 for a specific embodiment of the present application. FIG. 12 is a twelfth schematic view of the light-emitting substrate according to one embodiment of the present application. As shown in FIG. 12, the present application provides a light-emitting substrate 800. The light-emitting substrate 800 is different from the light-emitting substrate 600 in that the signal lines 20 has various layouts in the light-emitting substrate 800. The first signal line 21 is disposed on a left side of the second signal line 22, and/or the first signal line 21 is disposed on a right side of the second signal line 22. FIG. 12 only exemplarily shows that one single light-emitting units 30 alone is provided with a signal access terminal 211, two columns of light-emitting units 30 are electrically connected to the same signal access terminal 211, and three columns of the light-emitting units 30 are electrically connected to the same signal access terminal 211. The signal transmission includes left-to-right transmission or right-to-left transmission. With such a design, the present application realizes the various layouts of the signal lines 20 while reducing the number of the signal access terminals 211, and those skilled in the art can select an appropriate layout according to needs to improve the display performance.

In the present embodiment, the light-emitting substrate 800 includes a substrate 10, multiple signal lines 20, a connection line 24, and multiple light-emitting units 30. Specifically, the substrate 10 includes a first side and a second side arranged opposite to each other. The signal lines 20 are arranged on the substrate 10. The light-emitting units 30 are arranged in an array on the substrate 10. The light-emitting units 30 are electrically connected to one signal line 20. The signal lines 20 include a first signal line 21, a second signal line 22, and a third signal line 23. The light-emitting units 30 include a first light-emitting unit 31, a second light-emitting unit 32, and a third light-emitting unit 35. The first signal line 21 is electrically connected to the first light-emitting unit 31, the second signal line 22 is electrically connected to the second light-emitting unit 32, and the third signal line 23 is electrically connected to the third light-emitting unit 35. The first signal line 21 is provided with a signal access terminal 211 and a first connection terminal 212. The signal access terminal 211 is arranged on the first side, and the first connection terminal 212 is arranged on the second side. The second signal line 22 is provided with a second connection terminal 221 and a third connection terminal 231. The third signal line 23 is provided with a fourth connection terminal 232, and the first connection terminal 212 is electrically connected to the second connection terminal 221. The signal access terminal 211 is used for receiving signals. The third connection terminal 231 is electrically connected to the fourth connection terminal 232. The second connection terminal 221 is arranged on the second side. The third connection terminal 231 and the fourth connection terminal 232 are arranged on the first side. One end of the connection line 24 is electrically connected to the first connection terminal 212. Another end of the connection line 24 is electrically connected to the second connection terminal 221.

Figure 13:
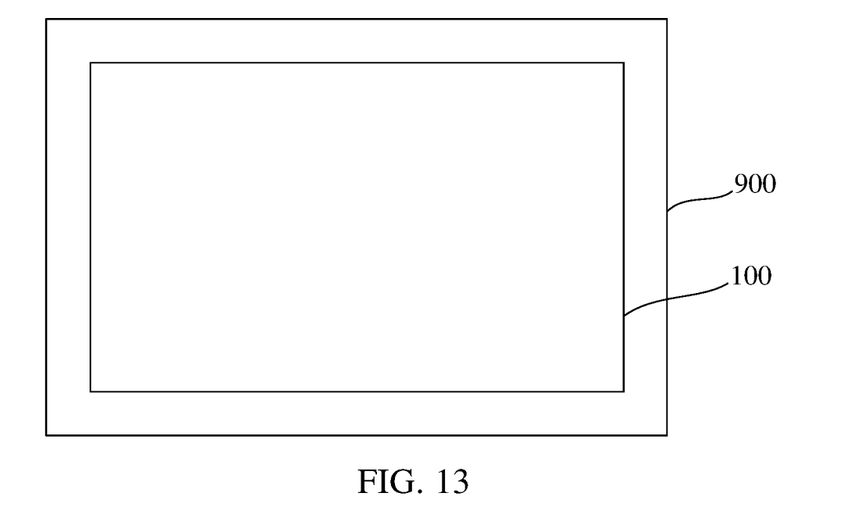
FIG. 13 is a schematic view of a display device according to one embodiment of the present application.

On the other hand, please refer to FIG. 13, which is a schematic structural view of a display device according to one embodiment of the present application. As shown in FIG. 13, the present application provides a display device 900 including the above-mentioned light-emitting substrate 100/200/300/400/500/600/700/800 (only the light-emitting substrate 100 is marked in the figure as an example).

The above-mentioned light-emitting substrates 100/200/300/400/500/600/700/800 can all be used in liquid crystal display devices or self-luminous display devices.

The present application provides a light-emitting substrate and a display device. The light-emitting substrate includes: a substrate 10, multiple signal lines 20, and multiple light-emitting units 30. The signal lines 20 are disposed on the substrate 10. The light-emitting units 30 are arranged in an array pattern on the substrate 10. The light-emitting units 30 are electrically connected to the signal lines 20. The signal lines 20 at least include a first signal line 21 and a second signal line 22. The light-emitting units 30 include a first light-emitting unit 31 and a second light-emitting unit 32. The first signal line 21 is electrically connected to the first light-emitting unit 31, and the second signal line 22 is electrically connected to the second light-emitting unit 32. The first signal line 21 is provided with a signal access terminal 211 and a first connection terminal 212, the second signal line 22 is provided with a second connection terminal 221, the first connection terminal 212 is electrically connected to the second connection terminal 221, and the signal access terminal 211 is configured to receive signals. The light-emitting substrate 100 of the present application reduces the number of the signal access terminals 211 by electrically connecting the first signal line 21 to the second signal line 22, thereby reducing product production costs and improving product competitiveness.

The display device can be any product or part with display functions, such as electronic paper, mobile phones, tablet computers, televisions, monitors, laptops, digital photo frames, and navigators.

The light-emitting substrate and the display device of the present application have been introduced in detail above. The working principles and embodiments of the present application are described with specific examples. The descriptions of the above embodiments are only provided for ease of understanding the present application. Those skilled in the art can modify the specific embodiments and application range according to the ideas of the present application. The content of the present specification shouldn't be construed as a limitation to the present application.

What is claimed is:

1. A light-emitting substrate, comprising:
a substrate;
multiple signal lines arranged on the substrate; and
multiple light-emitting units arranged in an array pattern on the substrate, the light-emitting units electrically connected to the signal lines;
wherein the signal lines at least comprise a first signal line and a second signal line, the light-emitting units comprise a first light-emitting unit and a second light-emitting unit, the first signal line is electrically connected to the first light-emitting unit, and the second signal line is electrically connected to the second light-emitting unit; and
the first signal line is provided with a signal access terminal and a first connection terminal, the second signal line is provided with a second connection terminal, the first connection terminal is electrically connected to the second connection terminal via a connection line disposed on the substrate, and the signal access terminal is configured for receiving signals to sequentially transmit the signals from the first signal line to the second signal line through the connection line.

2. The light-emitting substrate according to claim 1, wherein the substrate comprises a first side and a second side disposed opposite to each other, and wherein the signal access terminal is disposed on the first side, and the first connection terminal and the second connection terminal are disposed on the second side; or alternatively, the signal access terminal and the second connection terminal are disposed on the first side, and the first connection terminal is disposed on the second side.

3. The light-emitting substrate according to claim 1, wherein each of the light-emitting units comprises a driving chip and at least one light-emitting device, each of the driving chips is provided with a first pin and a second pin, the first pins are electrically connected to the light-emitting devices, and the second pins are electrically connected to the signal lines.

4. The light-emitting substrate according to claim 1, wherein the light-emitting units include a first light-emitting unit column and a second light-emitting unit column, the first signal line is electrically connected to the first light-emitting unit column, the second signal line is electrically connected to the second light-emitting unit column, and the first light-emitting unit column and the second light-emitting unit column are disposed adjacent to each other.

5. The light-emitting substrate according to claim 2, wherein one end of the connection line is electrically connected to the first connection terminal, and another end of the connection line is electrically connected to the second connection terminal.

6. The light-emitting substrate according to claim 2, wherein the light-emitting substrate further comprises multiple connection lines, one end of each of the connection lines is electrically connected to the first connection terminal, and another end of each of the connection lines is electrically connected to the second connection terminal.

7. The light-emitting substrate according to claim 2, wherein the light-emitting units further comprises a third light-emitting unit, the signal lines further comprise a third signal line, and the third signal line is electrically connected to the third light-emitting unit; and the third signal line is provided with a third connection terminal, the second connection terminal is electrically connected to the third connection terminal, and the third connection terminal is disposed on the first side or the second side.

8. The light-emitting substrate according to claim 2, wherein the light-emitting units further comprise a third light-emitting unit, the signal lines further comprise a third signal line, and the third signal line is electrically connected to the third light-emitting unit;

the second signal line is further provided with a third connection terminal, the third signal line is provided with a fourth connection terminal, and the third connection terminal is electrically connected to the fourth connection terminal; and wherein the third connection terminal and the fourth connection terminal are disposed on the first side; or alternatively, the third connection terminal is disposed on the first side, and the fourth connection terminal is disposed on the second side.

9. The light-emitting substrate according to claim 2, wherein the light-emitting units further comprise a third light-emitting unit, the signal lines further comprise a third signal line, and the third signal line is electrically connected to the third light-emitting unit;

the second signal line is further provided with a third connection terminal, the third signal line is provided with a fourth connection terminal, and the third connection terminal is electrically connected to the fourth connection terminal; and wherein the third connection terminal and the fourth connection terminal are disposed on the second side; or alternatively, the third connection terminal is disposed on the second side, and the fourth connection terminal is disposed on the first side.

10. The light-emitting substrate according to claim 1, wherein the first signal line is disposed on a left side of the second signal line, and/or the first signal line is disposed on a right side of the second signal line.

11. A display device comprising a light-emitting substrate, the light-emitting substrate comprising:

a substrate;

multiple signal lines arranged on the substrate; and multiple light-emitting units arranged in an array pattern on the substrate, the light-emitting units electrically connected to the signal lines;

wherein the signal lines at least comprise a first signal line and a second signal line, the light-emitting units comprise a first light-emitting unit and a second light-emitting unit, the first signal line is electrically connected to the first light-emitting unit, and the second signal line is electrically connected to the second light-emitting unit; and the first signal line is provided with a signal access terminal and a first connection terminal, the second signal line is provided with a second connection terminal, the first connection terminal is electrically connected to the second connection terminal via a connection line disposed on the substrate, and the signal access terminal is configured for receiving signals to sequentially transmit the signals from the first signal line to the second signal line through the connection line.

12. The display device according to claim 11, wherein the substrate comprises a first side and a second side disposed opposite to each other, the signal access terminal is disposed on the first side, and wherein the first connection terminal and the second connection terminal are disposed on the second side; or alternatively, the signal access terminal and the second connection terminal are disposed on the first side, and the first connection terminal is disposed on the second side.

13. The display device according to claim 11, wherein each of the light-emitting units comprises a driving chip and at least one light-emitting device, each of the driving chips is provided with a first pin and a second pin, the first pins are electrically connected to the light-emitting device, and the second pins are electrically connected to the signal lines.

14. The display device according to claim 11, wherein the light-emitting units include a first light-emitting unit column and a second light-emitting unit column, the first signal line is electrically connected to the first light-emitting unit column, the second signal line is electrically connected to the second light-emitting unit column, and the first light-emitting unit column and the second light-emitting unit column are disposed adjacent to each other.

15. The display device according to claim 12, wherein one end of the connection line is electrically connected to the first connection terminal, and another end of the connection line is electrically connected to the second connection terminal.

16. The display device according to claim 12, wherein the light-emitting substrate further comprises multiple connection lines, one end of each of the connection lines is electrically connected to the first connection terminal, and another end of each of the connection lines is electrically connected to the second connection terminal.

17. The display device according to claim 12, wherein the light-emitting units further comprises a third light-emitting unit, the signal lines further comprise a third signal line, and the third signal line is electrically connected to the third light-emitting unit; and the third signal line is provided with a third connection terminal, the second connection terminal is electrically connected to the third connection terminal, and the third connection terminal is disposed on the first side or the second side.

18. The display device according to claim 12, wherein the light-emitting units further comprise a third light-emitting unit, the signal lines further comprise a third signal line, and the third signal line is electrically connected to the third light-emitting unit;

the second signal line is further provided with a third connection terminal, the third signal line is provided with a fourth connection terminal, and the third connection terminal is electrically connected to the fourth connection terminal; and wherein the third connection terminal and the fourth connection terminal are disposed on the first side; or alternatively, the third connection terminal is disposed on the first side, and the fourth connection terminal is disposed on the second side.

19. The display device according to claim 12, wherein the light-emitting units further comprise a third light-emitting unit, the signal lines further comprise a third signal line, and the third signal line is electrically connected to the third light-emitting unit;

the second signal line is further provided with a third connection terminal, the third signal line is provided with a fourth connection terminal, and the third connection terminal is electrically connected to the fourth connection terminal; and wherein the third connection terminal and the fourth connection terminal are disposed on the second side; or alternatively, the third connection terminal is disposed on the second side, and the fourth connection terminal is disposed on the first side.

20. The display device according to claim 11, wherein the first signal line is disposed on a left side of the second signal line, and/or the first signal line is disposed on a right side of the second signal line.

* * * * *